(12) United States Patent
Pethe et al.

(10) Patent No.: US 10,192,783 B2
(45) Date of Patent: Jan. 29, 2019

(54) GATE CONTACT STRUCTURE OVER ACTIVE GATE AND METHOD TO FABRICATE SAME

(71) Applicant: Intel Corporation, Santa Clara, CA (US)

(72) Inventors: Abhijit Jayant Pethe, Hillsboro, OR (US); Tahir Ghani, Portland, OR (US); Mark Bohr, Aloha, OR (US); Clair Webb, Aloha, OR (US); Harry Gomez, Hillsboro, OR (US); Annalisa Cappellani, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/266,819

(22) Filed: Sep. 15, 2016

(65) Prior Publication Data

US 2017/0004998 A1    Jan. 5, 2017

Related U.S. Application Data

(63) Continuation of application No. 13/622,974, filed on Sep. 19, 2012, now Pat. No. 9,461,143.

(51) Int. Cl.
*H01L 21/70* (2006.01)
*H01L 21/768* (2006.01)
(Continued)

(52) U.S. Cl.
CPC .. *H01L 21/76897* (2013.01); *H01L 21/28008* (2013.01); *H01L 21/31111* (2013.01);
(Continued)

(58) Field of Classification Search
CPC .................................. H01L 21/76895
See application file for complete search history.

(56) References Cited

U.S. PATENT DOCUMENTS 5,780,339 A    7/1998  Liu et al.
6,445,050 B1   9/2002  Chediak et al.
(Continued)

FOREIGN PATENT DOCUMENTS

CN    101996874 A    3/2011
EP    0 448 307      9/1991
(Continued)

OTHER PUBLICATIONS

Office Action received for Chinese Patent Application No. 201380043706.X. dated May 3, 2017, 16 pages, including English translation.
(Continued)

*Primary Examiner* — Vongsavanh Sengdara
(74) *Attorney, Agent, or Firm* — Schwabe, Williamson & Wyatt, P.C.

(57) ABSTRACT

Gate contact structures disposed over active portions of gates and methods of forming such gate contact structures are described. For example, a semiconductor structure includes a substrate having an active region and an isolation region. A gate structure has a portion disposed above the active region and a portion disposed above the isolation region of the substrate. Source and drain regions are disposed in the active region of the substrate, on either side of the portion of the gate structure disposed above the active region. A gate contact structure is disposed on the portion of the gate structure disposed above the active region of the substrate.

18 Claims, 10 Drawing Sheets

(51) Int. Cl.
  *H01L 29/66* (2006.01)
  *H01L 29/78* (2006.01)
  *H01L 21/28* (2006.01)
  *H01L 21/311* (2006.01)
  *H01L 23/522* (2006.01)
  *H01L 23/532* (2006.01)
(52) U.S. Cl.
  CPC .. *H01L 21/76807* (2013.01); *H01L 21/76895* (2013.01); *H01L 23/5226* (2013.01); *H01L 23/53257* (2013.01); *H01L 29/66545* (2013.01); *H01L 29/66583* (2013.01); *H01L 29/785* (2013.01); H01L 21/76834 (2013.01)

(56) References Cited

U.S. PATENT DOCUMENTS

| | | | |
|---|---|---|---|
| 7,932,577 B2 | 4/2011 | Webb et al. | |
| 8,084,311 B1 | 12/2011 | Horak et al. | |
| 2002/0055222 A1* | 5/2002 | Kim | H01L 21/76897 438/239 |
| 2004/0169207 A1* | 9/2004 | Park | H01L 21/82343 257/250 |
| 2004/0173860 A1* | 9/2004 | Uryuu | H01L 29/42368 257/411 |
| 2005/0019993 A1 | 1/2005 | Lee et al. | |
| 2005/0167758 A1 | 8/2005 | Ahn et al. | |
| 2006/0249783 A1* | 11/2006 | Lojek | H01L 29/42332 257/327 |
| 2007/0114603 A1 | 5/2007 | Inagaki | |
| 2008/0079163 A1* | 4/2008 | Kurita | H01L 21/6835 257/759 |
| 2009/0108379 A1* | 4/2009 | Oosuka | H01L 21/28525 257/412 |
| 2009/0140334 A1* | 6/2009 | Chang | H01L 29/0692 257/336 |
| 2010/0230737 A1 | 9/2010 | Kuroki | |
| 2011/0042752 A1 | 2/2011 | Mayuzumi | |
| 2011/0108888 A1* | 5/2011 | Or-Bach | H01L 21/76254 257/204 |
| 2011/0156107 A1* | 6/2011 | Bohr | H01L 21/76831 257/288 |
| 2012/0001271 A1* | 1/2012 | Chae | H01L 29/4238 257/401 |
| 2012/0030737 A1 | 2/2012 | Pagan et al. | |
| 2012/0032275 A1 | 2/2012 | Haran et al. | |
| 2013/0285157 A1 | 10/2013 | Yin et al. | |

FOREIGN PATENT DOCUMENTS

| | | |
|---|---|---|
| EP | 1 211 716 | 6/2002 |
| JP | 63036564 | 2/1988 |
| JP | 08181323 | 7/1996 |
| KR | 1020100131478 | 12/2010 |
| WO | WO-2011/111133 | 9/2011 |
| WO | WO-2012/065377 | 5/2012 |
| WO | WO-2013/095548 | 6/2013 |

OTHER PUBLICATIONS

International Preliminary Report on Patentability from PCT/US2013/057116 dated Apr. 2, 2015, 9 pgs.
Extended European Search Report from European Patent Application No. 13838318.7 dated May 18, 2016, 11 pgs.
Office Action for Taiwanese Patent Application No. 102131803, dated Jan. 20, 2015, 16 pgs.
International Search Report and Written Opinion of the International Searching Authority dated Dec. 11, 2013, in International Patent Application No. PCT/US2013/057116.
Office Action from Korean Patent Application No. 10-2016-7033155 dated Sep. 10, 2018, 17 pages.

* cited by examiner

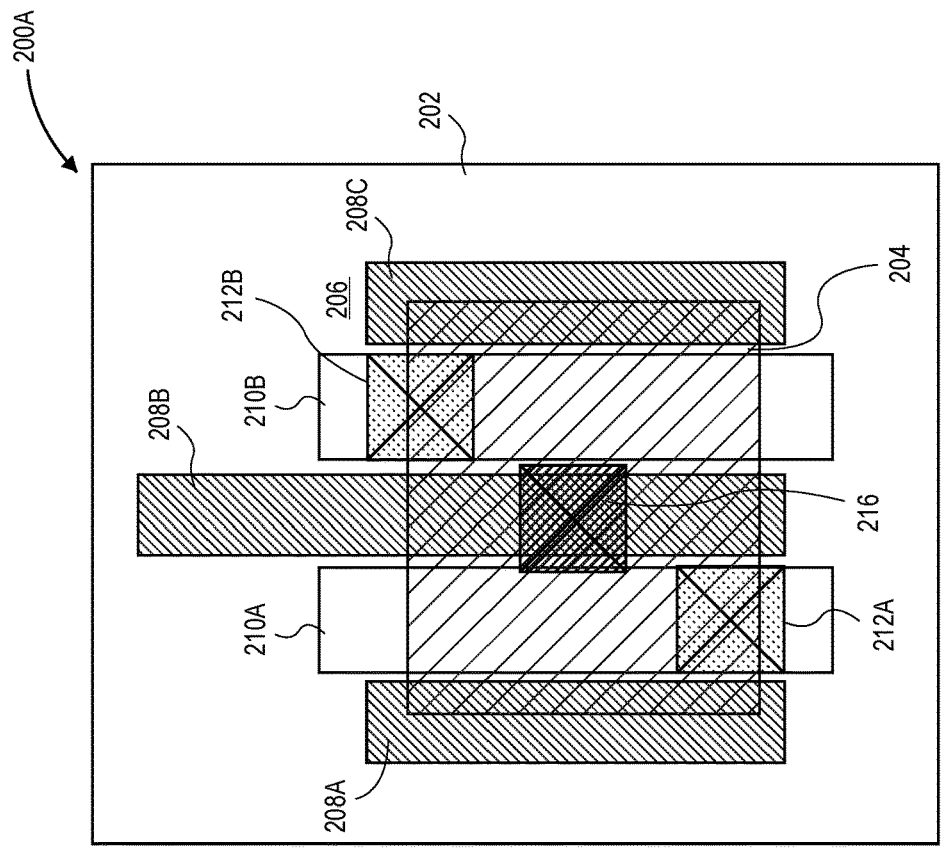
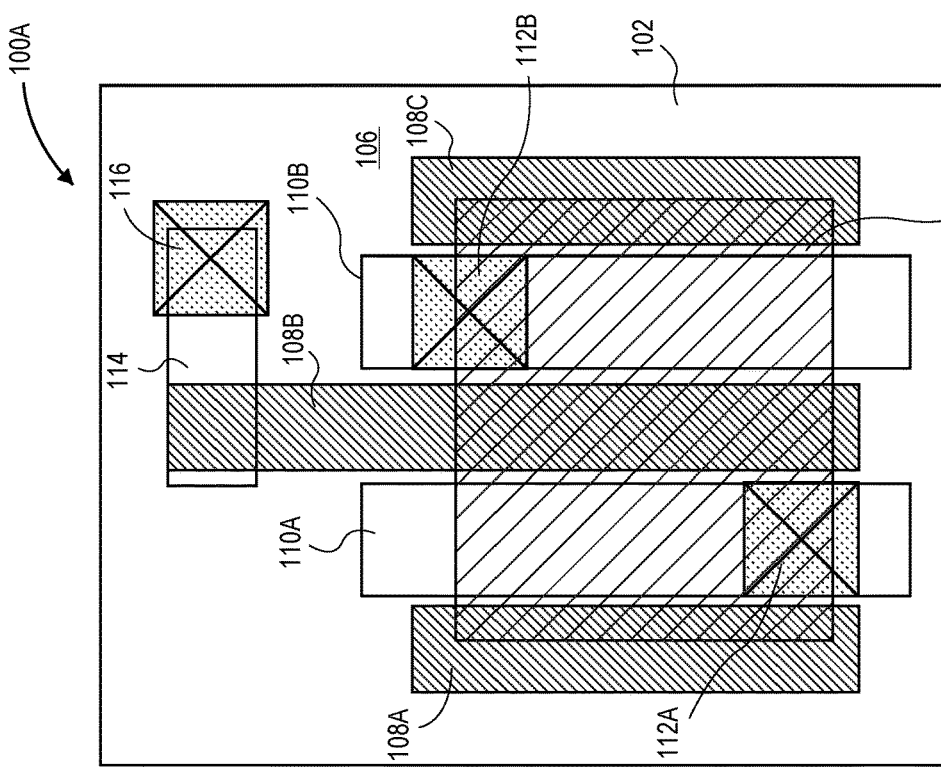
FIG. 2A
FIG. 1A

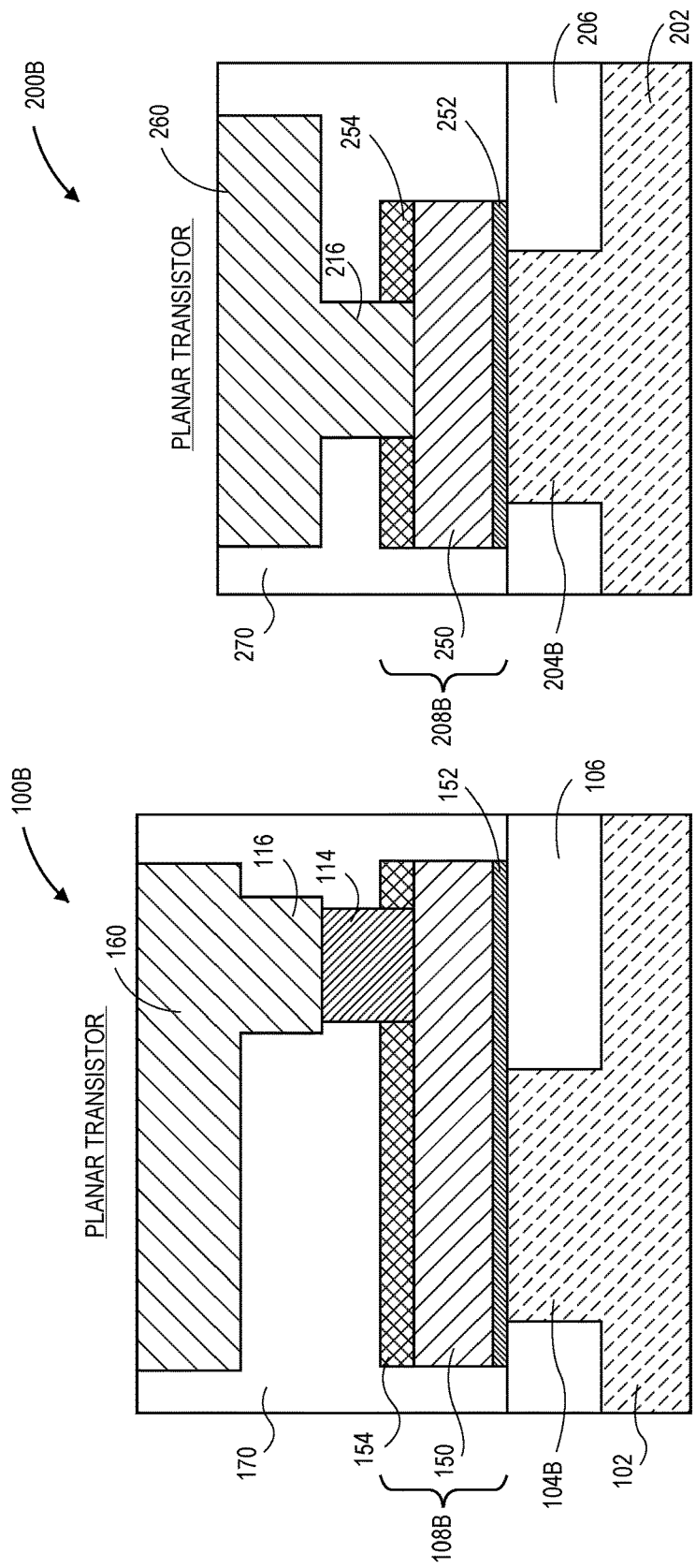

GATE CONTACT STRUCTURE OVER ACTIVE GATE AND METHOD TO FABRICATE SAME

CROSS-REFERENCE TO RELATED APPLICATIONS

This application is a continuation of U.S. patent application Ser. No. 13/622,974, filed on Sep. 19, 2012, the entire contents of which are hereby incorporated by reference herein.

TECHNICAL FIELD

Embodiments of the invention are in the field of semiconductor devices and processing and, in particular, gate contact structures disposed over active portions of gates, and methods of forming such gate contact structures.

BACKGROUND

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory or logic devices on a chip, lending to the fabrication of products with increased capacity. The drive for ever-more capacity, however, is not without issue. The necessity to optimize the performance of each device becomes increasingly significant.

In the manufacture of integrated circuit devices, multi-gate transistors, such as tri-gate transistors, have become more prevalent as device dimensions continue to scale down. In conventional processes, tri-gate transistors are generally fabricated on either bulk silicon substrates or silicon-on-insulator substrates. In some instances, bulk silicon substrates are preferred due to their lower cost and because they enable a less complicated tri-gate fabrication process.

Scaling multi-gate transistors has not been without consequence, however. As the dimensions of these fundamental building blocks of microelectronic circuitry are reduced and as the sheer number of fundamental building blocks fabricated in a given region is increased, the constraints on the lithographic processes used to pattern these building blocks have become overwhelming. In particular, there may be a trade-off between the smallest dimension of a feature patterned in a semiconductor stack (the critical dimension) and the spacing between such features.

BRIEF DESCRIPTION OF THE DRAWINGS

FIG. 1A illustrates a plan view of a semiconductor device having a gate contact disposed over an inactive portion of a gate electrode.

FIG. 1B illustrates a cross-sectional view of a planar semiconductor device having a gate contact disposed over an inactive portion of a gate electrode.

FIG. 2A illustrates a plan view of a semiconductor device having a gate contact via disposed over an active portion of a gate electrode, in accordance with an embodiment of the present invention.

FIG. 2B illustrates a cross-sectional view of a planar semiconductor device having a gate contact via disposed over an active portion of a gate electrode, in accordance with an embodiment of the present invention.

FIGS. 3A-3F illustrate cross-sectional views representing various operations in a method of fabricating a semiconductor structure having a gate contact structure disposed over an active portion of a gate, in accordance with an embodiment of the present invention, with:

FIG. 3A illustrating a semiconductor structure following trench contact formation;

FIG. 3B illustrating a recessing of trench contacts and formation of an insulating cap layer thereon within the spacers of the structure of FIG. 3A;

FIG. 3C illustrating formation and patterning of an inter-layer dielectric (ILD) and hardmask stack above the structure of FIG. 3B;

FIG. 3D illustrating formation of via openings in the inter-layer dielectric (ILD) and extending from the metal (0) trench to one or more of the recessed trench contacts of the structure of FIG. 3C;

FIG. 3E illustrating formation of via openings in the inter-layer dielectric (ILD) and extending from the metal (0) trench to one or more gate stack structures of the structure of FIG. 3D;

FIG. 3F illustrating the formation of a metal contact structure in the metal (0) trench and via openings of the structure described in association with FIG. 3E.

DESCRIPTION OF THE EMBODIMENTS

Figure 2C:
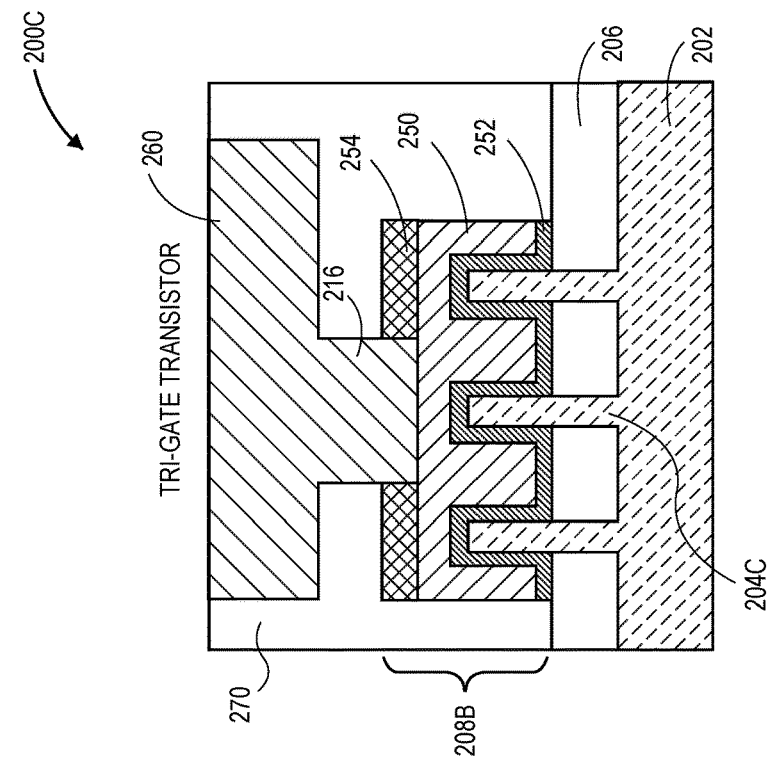
FIG. 2C illustrates a cross-sectional view of a non-planar semiconductor device having a gate contact via disposed over an active portion of a gate electrode, in accordance with an embodiment of the present invention.

Gate contact structures disposed over active portions of gates and methods of forming such gate contact structures are described. In the following description, numerous specific details are set forth, such as specific integration and material regimes, in order to provide a thorough understanding of embodiments of the present invention. It will be apparent to one skilled in the art that embodiments of the present invention may be practiced without these specific details. In other instances, well-known features, such as integrated circuit design layouts, are not described in detail in order to not unnecessarily obscure embodiments of the present invention. Furthermore, it is to be understood that the various embodiments shown in the Figures are illustrative representations and are not necessarily drawn to scale.

One or more embodiments of the present invention are directed to semiconductor structures or devices having one or more gate contact structures (e.g., as gate contact vias) disposed over active portions of gate electrodes of the semiconductor structures or devices. One or more embodiments of the present invention are directed to methods of fabricating semiconductor structures or devices having one or more gate contact structures formed over active portions of gate electrodes of the semiconductor structures or devices. Approaches described herein may be used to reduce a standard cell area by enabling gate contact formation over active gate regions. In one or more embodiments, the gate contact structures fabricated to contact the gate electrodes are self-aligned via structures.

In technologies where space and layout constraints are somewhat relaxed compared with current generation space and layout constraints, a contact to gate structure may be fabricated by making contact to a portion of the gate electrode disposed over an isolation region. As an example, FIG. 1A illustrates a plan view of a semiconductor device having a gate contact disposed over an inactive portion of a gate electrode.

Referring to FIG. 1A, a semiconductor structure or device 100A includes a diffusion or active region 104 disposed in a substrate 102, and within an isolation region 106. One or more gate lines (also known as poly lines), such as gate lines 108A, 108B and 108C are disposed over the diffusion or active region 104 as well as over a portion of the isolation region 106. Source or drain contacts (also known as trench contacts), such as contacts 110A and 110B, are disposed over source and drain regions of the semiconductor structure or device 100A. Trench contact vias 112A and 112B provide contact to trench contacts 110A and 110B, respectively. A separate gate contact 114, and overlying gate contact via 116, provides contact to gate line 108B. In contrast to the source or drain trench contacts 110A or 110B, the gate contact 114 is disposed, from a plan view perspective, over isolation region 106, but not over diffusion or active region 104. Furthermore, neither the gate contact 114 nor gate contact via 116 is disposed between the source or drain trench contacts 110A an 110B.

FIG. 1B illustrates a cross-sectional view of a planar semiconductor device having a gate contact disposed over an inactive portion of a gate electrode. Referring to FIG. 1B, a semiconductor structure or device 100B, e.g. a planar version of device 100A of FIG. 1A, includes a planar diffusion or active region 104B disposed in substrate 102, and within isolation region 106. Gate line 108B is disposed over the planar diffusion or active region 104B as well as over a portion of the isolation region 106. As shown, gate line 108B includes a gate electrode 150 and gate dielectric layer 152. As well, a dielectric cap layer 154 may be disposed on the gate electrode, e.g., a dielectric cap layer for protecting a metal gate electrode. Gate contact 114, and overlying gate contact via 116 are also seen from this perspective, along with an overlying metal interconnect 160, all of which are disposed in inter-layer dielectric stacks or layers 170. Also seen from the perspective of FIG. 1B, the gate contact 114 and gate contact via 116 are disposed over isolation region 106, but not over planar diffusion or active region 104B.

Figure 1C:
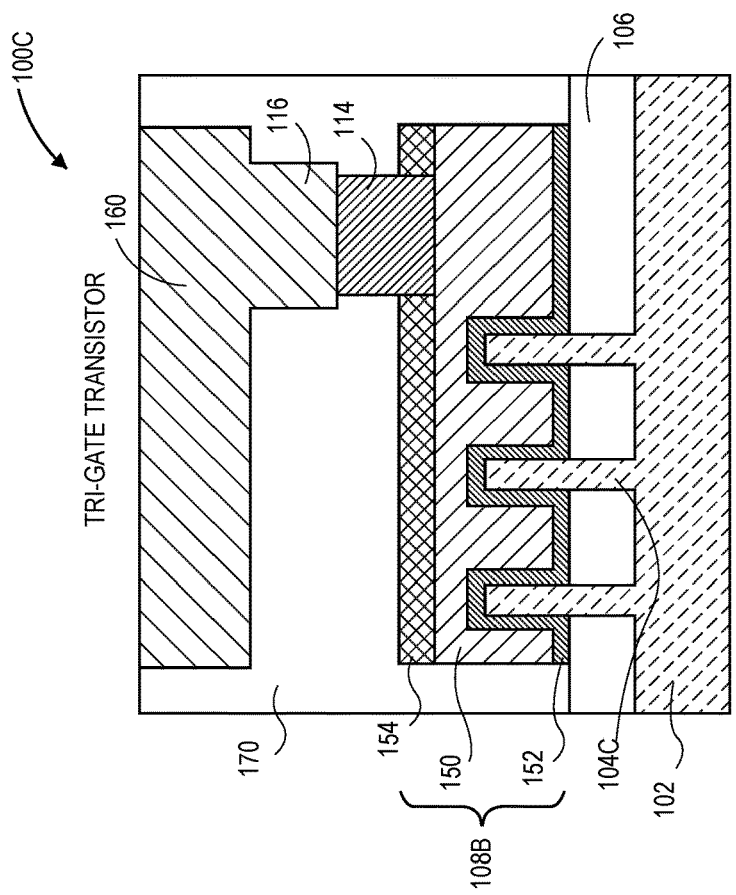
FIG. 1C illustrates a cross-sectional view of a non-planar semiconductor device having a gate contact disposed over an inactive portion of a gate electrode.

FIG. 1C illustrates a cross-sectional view of a non-planar semiconductor device having a gate contact disposed over an inactive portion of a gate electrode. Referring to FIG. 1C, a semiconductor structure or device 100C, e.g. a non-planar version of device 100A of FIG. 1A, includes a non-planar diffusion or active region 104C (e.g., a fin structure) formed from substrate 102, and within isolation region 106. Gate line 108B is disposed over the non-planar diffusion or active region 104C as well as over a portion of the isolation region 106. As shown, gate line 108B includes a gate electrode 150 and gate dielectric layer 152, along with a dielectric cap layer 154. Gate contact 114, and overlying gate contact via 116 are also seen from this perspective, along with an overlying metal interconnect 160, all of which are disposed in inter-layer dielectric stacks or layers 170. Also seen from the perspective of FIG. 1C, the gate contact 114 is disposed over isolation region 106, but not over non-planar diffusion or active region 104C.

Referring again to FIGS. 1A-1C, the arrangement of semiconductor structure or device 100A-100C, respectively, places the gate contact over isolation regions. Such an arrangement wastes layout space. However, placing the gate contact over active regions would require either an extremely tight registration budget or gate dimensions would have to increase to provide enough space to land the gate contact. Furthermore, historically, contact to gate over diffusion regions has been avoided for risk of drilling through conventional gate material (e.g., polysilicon) and contacting the underlying active region. One or more embodiments described herein address the above issues by providing feasible approaches, and the resulting structures, to fabricating contact structures that contact portions of a gate electrode formed over a diffusion or active region.

As an example, FIG. 2A illustrates a plan view of a semiconductor device having a gate contact via disposed over an active portion of a gate electrode, in accordance with an embodiment of the present invention. Referring to FIG. 2A, a semiconductor structure or device 200A includes a diffusion or active region 204 disposed in a substrate 202, and within an isolation region 206. One or more gate lines, such as gate lines 208A, 208B and 208C are disposed over the diffusion or active region 204 as well as over a portion of the isolation region 206. Source or drain trench contacts, such as trench contacts 210A and 210B, are disposed over source and drain regions of the semiconductor structure or device 200A. Trench contact vias 212A and 212B provide contact to trench contacts 210A and 210B, respectively. A gate contact via 216, with no intervening separate gate contact layer, provides contact to gate line 208B. In contrast to FIG. 1A, the gate contact 216 is disposed, from a plan view perspective, over the diffusion or active region 204 and between the source or drain contacts 210A and 210B.

FIG. 2B illustrates a cross-sectional view of a planar semiconductor device having a gate contact via disposed over an active portion of a gate electrode, in accordance with an embodiment of the present invention. Referring to FIG. 2B, a semiconductor structure or device 200B, e.g. a planar version of device 200A of FIG. 2A, includes a planar diffusion or active region 204B disposed in substrate 202, and within isolation region 206. Gate line 208B is disposed over the planar diffusion or active region 204B as well as over a portion of the isolation region 206. As shown, gate line 208B includes a gate electrode 250 and gate dielectric layer 252. As well, a dielectric cap layer 254 may be disposed on the gate electrode, e.g., a dielectric cap layer for protecting a metal gate electrode. Gate contact via 216 is also seen from this perspective, along with an overlying metal interconnect 260, both of which are disposed in inter-layer dielectric stacks or layers 270. Also seen from the perspective of FIG. 2B, the gate contact via 216 is disposed over planar diffusion or active region 204B.

FIG. 2C illustrates a cross-sectional view of a non-planar semiconductor device having a gate contact via disposed over an active portion of a gate electrode, in accordance with an embodiment of the present invention. Referring to FIG. 2C, a semiconductor structure or device 200C, e.g. a non-planar version of device 200A of FIG. 2A, includes a non-planar diffusion or active region 204C (e.g., a fin structure) formed from substrate 202, and within isolation region 206. Gate line 208B is disposed over the non-planar diffusion or active region 204C as well as over a portion of the isolation region 206. As shown, gate line 208B includes a gate electrode 250 and gate dielectric layer 252, along with a dielectric cap layer 254. The gate contact via 216 is also seen from this perspective, along with an overlying metal interconnect 260, both of which are disposed in inter-layer dielectric stacks or layers 270. Also seen from the perspective of FIG. 2C, the gate contact via 216 is disposed over non-planar diffusion or active region 204C.

Thus, referring again to FIGS. 2A-2C, in an embodiment, trench contact vias 212A, 212B and gate contact via 216 are formed in a same layer and are essentially co-planar. In comparison to FIGS. 1A-1C, the contact to the gate line would otherwise include and additional gate contact layer, e.g., which could be run perpendicular to the corresponding gate line. In the structure(s) described in association with FIGS. 2A-2C, however, the fabrication of structures 200A-200C, respectively, enables the landing of a contact directly from a metal interconnect layer on an active gate portion without shorting to adjacent source drain regions. In an embodiment, such an arrangement provides a large area reduction in circuit layout by eliminating the need to extend transistor gates on isolation to form a reliable contact. As used throughout, in an embodiment, reference to an active portion of a gate refers to that portion of a gate line or structure disposed over (from a plan view perspective) an active or diffusion region of an underlying substrate. In an embodiment, reference to an inactive portion of a gate refers to that portion of a gate line or structure disposed over (from a plan view perspective) an isolation region of an underlying substrate.

In an embodiment, the semiconductor structure or device 200 is a planar device, such as shown in FIG. 2B. In another embodiment, the semiconductor structure or device 200 is a non-planar device such as, but not limited to, a fin-FET or a tri-gate device. In such an embodiment, a corresponding semiconducting channel region is composed of or is formed in a three-dimensional body. In one such embodiment, the gate electrode stacks of gate lines 208A-208C surround at least a top surface and a pair of sidewalls of the three-dimensional body. In another embodiment, at least the channel region is made to be a discrete three-dimensional body, such as in a gate-all-around device. In one such embodiment, the gate electrode stacks of gate lines 208A-208C each completely surrounds the channel region.

Substrate 202 may be composed of a semiconductor material that can withstand a manufacturing process and in which charge can migrate. In an embodiment, substrate 202 is a bulk substrate composed of a crystalline silicon, silicon/germanium or germanium layer doped with a charge carrier, such as but not limited to phosphorus, arsenic, boron or a combination thereof, to form diffusion or active region 204. In one embodiment, the concentration of silicon atoms in bulk substrate 202 is greater than 97%. In another embodiment, bulk substrate 202 is composed of an epitaxial layer grown atop a distinct crystalline substrate, e.g. a silicon epitaxial layer grown atop a boron-doped bulk silicon mono-crystalline substrate. Bulk substrate 202 may alternatively be composed of a group III-V material. In an embodiment, bulk substrate 202 is composed of a III-V material such as, but not limited to, gallium nitride, gallium phosphide, gallium arsenide, indium phosphide, indium antimonide, indium gallium arsenide, aluminum gallium arsenide, indium gallium phosphide, or a combination thereof. In one embodiment, bulk substrate 202 is composed of a III-V material and the charge-carrier dopant impurity atoms are ones such as, but not limited to, carbon, silicon, germanium, oxygen, sulfur, selenium or tellurium. In an alternative embodiment, substrate 202 is a silicon- or semiconductor-on insulator (SOI) substrate.

Isolation region 206 may be composed of a material suitable to ultimately electrically isolate, or contribute to the isolation of, portions of a permanent gate structure from an underlying bulk substrate or isolate active regions formed within an underlying bulk substrate, such as isolating fin active regions. For example, in one embodiment, the isolation region 206 is composed of a dielectric material such as, but not limited to, silicon dioxide, silicon oxy-nitride, silicon nitride, or carbon-doped silicon nitride.

Gate lines 208A, 208B and 208C may be composed of gate electrode stacks which each include a gate dielectric layer and a gate electrode layer (not shown as separate layers herein). In an embodiment, the gate electrode of gate electrode stack is composed of a metal gate and the gate dielectric layer is composed of a high-K material. For example, in one embodiment, the gate dielectric layer is composed of a material such as, but not limited to, hafnium oxide, hafnium oxy-nitride, hafnium silicate, lanthanum oxide, zirconium oxide, zirconium silicate, tantalum oxide, barium strontium titanate, barium titanate, strontium titanate, yttrium oxide, aluminum oxide, lead scandium tantalum oxide, lead zinc niobate, or a combination thereof. Furthermore, a portion of gate dielectric layer may include a layer of native oxide formed from the top few layers of the substrate 202. In an embodiment, the gate dielectric layer is composed of a top high-k portion and a lower portion composed of an oxide of a semiconductor material. In one embodiment, the gate dielectric layer is composed of a top portion of hafnium oxide and a bottom portion of silicon dioxide or silicon oxy-nitride.

In one embodiment, the gate electrode is composed of a metal layer such as, but not limited to, metal nitrides, metal carbides, metal silicides, metal aluminides, hafnium, zirconium, titanium, tantalum, aluminum, ruthenium, palladium, platinum, cobalt, nickel or conductive metal oxides. In a specific embodiment, the gate electrode is composed of a non-workfunction-setting fill material formed above a metal workfunction-setting layer.

Spacers associated with the gate electrode stacks may be composed of a material suitable to ultimately electrically isolate, or contribute to the isolation of, a permanent gate structure from adjacent conductive contacts, such as self-aligned contacts. For example, in one embodiment, the spacers are composed of a dielectric material such as, but not limited to, silicon dioxide, silicon oxy-nitride, silicon nitride, or carbon-doped silicon nitride.

Any or all of contacts 210A and 210B and vias 212A, 212B and 216 may be composed of a conductive material. In an embodiment, contacts any or all of these contacts or vias are composed of a metal species. The metal species may be a pure metal, such as tungsten, nickel, or cobalt, or may be an alloy such as a metal-metal alloy or a metal-semiconductor alloy (e.g., such as a silicide material).

More generally, one or more embodiments are directed to approaches for, and structures formed from, landing a gate contact via directly on an active transistor gate. Such approaches may eliminate the need for extension of a gate line on isolation for contact purposes. Such approaches may also eliminate the need for a separate gate contact (GCN) layer to conduct signals from a gate line or structure. In an embodiment, eliminating the above features is achieved by recessing contact metals in a trench contact (TCN) and introducing an additional dielectric material in the process flow (e.g., TILA). The additional dielectric material is included as a trench contact dielectric cap layer with etch characteristics different from the gate dielectric material cap layer already used for trench contact alignment in a gate aligned contact process (GAP) processing scheme (e.g., GILA).

As an exemplary fabrication scheme, FIGS. 3A-3F illustrate cross-sectional views representing various operations in a method of fabricating a semiconductor structure having a gate contact structure disposed over an active portion of a gate, in accordance with an embodiment of the present invention.

Figure 3A:
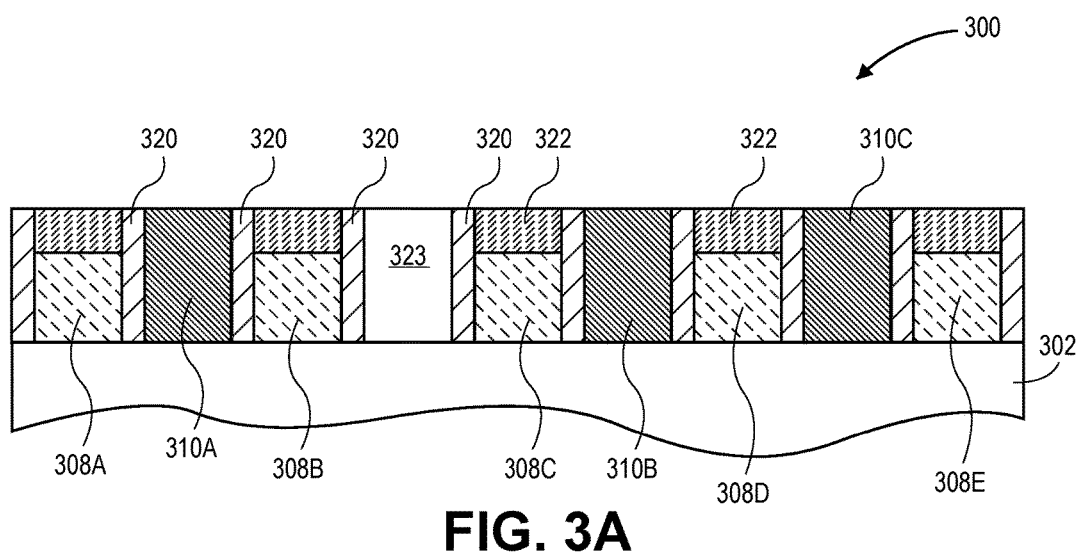

Referring to FIG. 3A, a semiconductor structure 300 is provided following trench contact (TCN) formation. It is to be understood that the specific arrangement of structure 300 is used for illustration purposes only, and that a variety of possible layouts may benefit from embodiments of the invention described herein. The semiconductor structure 300 includes one or more gate stack structures, such as gate stack structures 308A-308E disposed above a substrate 302. The gate stack structures may include a gate dielectric layer and a gate electrode, as described above in association with FIG. 2. Trench contacts, e.g., contacts to diffusion regions of substrate 302, such as trench contacts 310A-310C are also included in structure 300 and are spaced apart from gate stack structures 308A-308E by dielectric spacers 320. An insulating cap layer 322 may be disposed on the gate stack structures 308A-308E (e.g., GILA), as is also depicted in FIG. 3A. As is also depicted in FIG. 3A, contact blocking regions or "contact plugs," such as region 323 fabricated from an inter-layer dielectric material, may be included in regions where contact formation is to be blocked.

A process used to provide structure 300 may be one described in International Patent Application No. PCT/US11/66989, entitled "Gate Aligned Contact and Method to Fabricate Same," filed Dec. 22, 2011 by Intel Corp., incorporated by reference herein. For example, a trench contact etch engineered selective to the insulating cap layer 322 may be used to form self-aligned contacts 310A-310C.

In an embodiment, providing structure 300 involves formation of a contact pattern which is essentially perfectly aligned to an existing gate pattern while eliminating the use of a lithographic step with exceedingly tight registration budget. In one such embodiment, this approach enables the use of intrinsically highly selective wet etching (e.g., versus conventionally implemented dry or plasma etching) to generate contact openings. In an embodiment, a contact pattern is formed by utilizing an existing gate pattern in combination with a contact plug lithography operation. In one such embodiment, the approach enables elimination of the need for an otherwise critical lithography operation to generate a contact pattern, as used in conventional approaches. In an embodiment, a trench contact grid is not separately patterned, but is rather formed between poly (gate) lines. For example, in one such embodiment, a trench contact grid is formed subsequent to gate grating patterning but prior to gate grating cuts.

Furthermore, the gate stack structures 308A-308E may be fabricated by a replacement gate process. In such a scheme, dummy gate material such as polysilicon or silicon nitride pillar material, may be removed and replaced with permanent gate electrode material. In one such embodiment, a permanent gate dielectric layer is also formed in this process, as opposed to being carried through from earlier processing. In an embodiment, dummy gates are removed by a dry etch or wet etch process. In one embodiment, dummy gates are composed of polycrystalline silicon or amorphous silicon and are removed with a dry etch process comprising $SF_6$. In another embodiment, dummy gates are composed of polycrystalline silicon or amorphous silicon and are removed with a wet etch process comprising aqueous $NH_4OH$ or tetramethylammonium hydroxide. In one embodiment, dummy gates are composed of silicon nitride and are removed with a wet etch including aqueous phosphoric acid.

In an embodiment, one or more approaches described herein contemplate essentially a dummy and replacement gate process in combination with a dummy and replacement contact process to arrive at structure 300. In one such embodiment, the replacement contact process is performed after the replacement gate process to allow high temperature anneal of at least a portion of the permanent gate stack. For example, in a specific such embodiment, an anneal of at least a portion of the permanent gate structures, e.g., after a gate dielectric layer is formed, is performed at a temperature greater than approximately 600 degrees Celsius. The anneal is performed prior to formation of the permanent contacts.

Figure 3B:
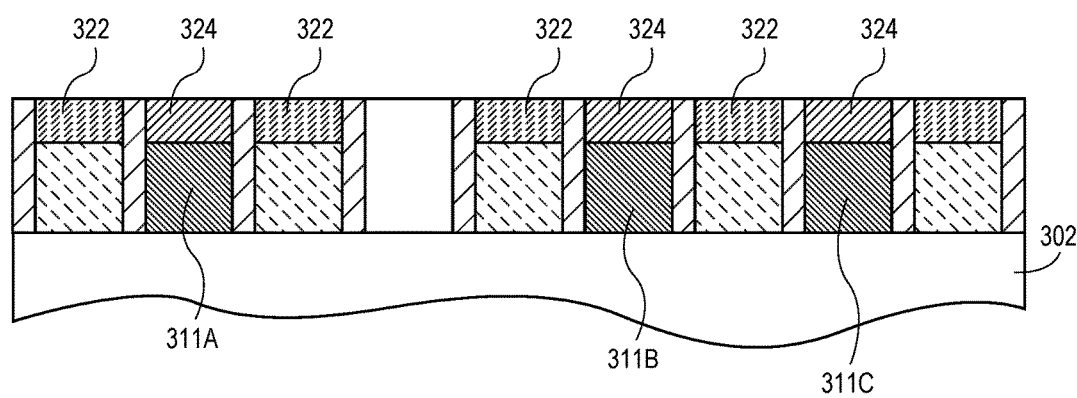

Referring to FIG. 3B, the trench contacts 310A-310C of the structure 300 are recessed within spacers 320 to provide recessed trench contacts 311A-311C that have a height below the top surface of spacers 320 and insulating cap layer 322. An insulating cap layer 324 is then formed on recessed trench contacts 311A-311C (e.g., TILA). In accordance with an embodiment of the present invention, the insulating cap layer 324 on recessed trench contacts 311A-311C is composed of a material having a different etch characteristic than insulating cap layer 322 on gate stack structures 308A-308E. As will be seen in subsequent processing operations, such a difference may be exploited to etch one of 322/324 selectively from the other of 322/324.

The trench contacts 310A-310C may be recessed by a process selective to the materials of spacers 320 and insulating cap layer 322. For example, in one embodiment, the trench contacts 310A-310C are recessed by an etch process such as a wet etch process or dry etch process. Insulating cap layer 324 may be formed by a process suitable to provide a conformal and sealing layer above the exposed portions of trench contacts 310A-310C. For example, in one embodiment, insulating cap layer 324 is formed by a chemical vapor deposition (CVD) process as a conformal layer above the entire structure. The conformal layer is then planarized, e.g., by chemical mechanical polishing (CMP), to provide insulating cap layer 324 material only above trench contacts 310A-310C, and re-exposing spacers 320 and insulating cap layer 322.

Regarding suitable material combinations for insulating cap layers 322/324, in one embodiment, one of the pair of 322/324 is composed of silicon oxide while the other is composed of silicon nitride. In another embodiment, one of the pair of 322/324 is composed of silicon oxide while the other is composed of carbon doped silicon nitride. In another embodiment, one of the pair of 322/324 is composed of silicon oxide while the other is composed of silicon carbide. In another embodiment, one of the pair of 322/324 is composed of silicon nitride while the other is composed of carbon doped silicon nitride. In another embodiment, one of the pair of 322/324 is composed of silicon nitride while the other is composed of silicon carbide. In another embodiment, one of the pair of 322/324 is composed of carbon doped silicon nitride while the other is composed of silicon carbide.

Figure 3C:
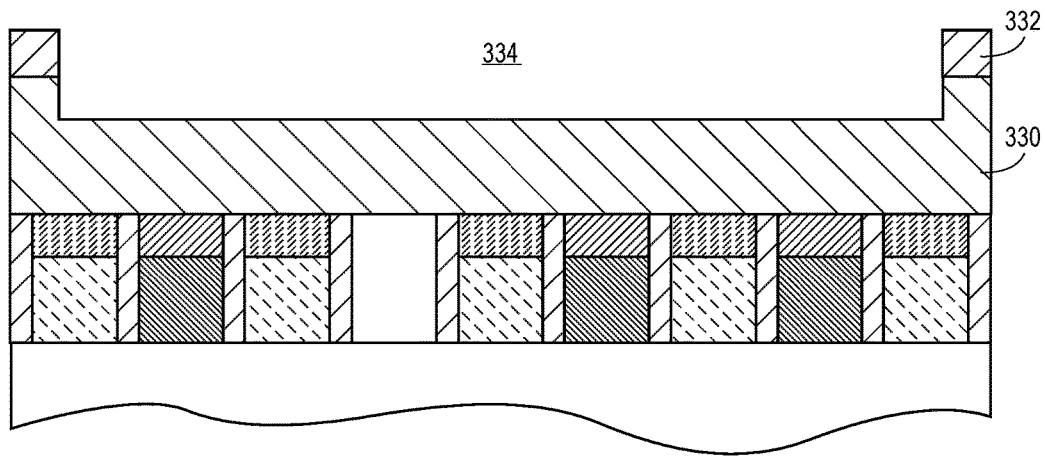

Referring to FIG. 3C, an inter-layer dielectric (ILD) 330 and hardmask 332 stack is formed and patterned to provide, e.g., a metal (0) trench 334 patterned above the structure of FIG. 3B.

The inter-layer dielectric (ILD) 330 may be composed of a material suitable to electrically isolate metal features ultimately formed therein while maintaining a robust structure between front end and back end processing. Furthermore, in an embodiment, the composition of the ILD 330 is selected to be consistent with via etch selectivity for trench contact dielectric cap layer and gate dielectric cap layer patterning, as described in greater detail below in association with FIGS. 3D and 3E. In one embodiment, the ILD 330 is composed of a single or several layers of silicon oxide or a single or several layers of a carbon doped oxide (CDO) material. However, in other embodiments, the ILD 330 has a bi-layer composition with a top portion composed of a different material than an underlying bottom portion of the ILD 330, as described in greater detail below in association with FIG. 4. The hardmask layer 332 may be composed of a material suitable to act as a subsequent sacrificial layer. For example, in one embodiment, the hardmask layer 332 is composed substantially of carbon, e.g., as a layer of cross-linked organic polymer. In other embodiments, a silicon nitride or carbon-doped silicon nitride layer is used as a hardmask 332. The inter-layer dielectric (ILD) 330 and hardmask 332 stack may be patterned by a lithography and etch process.

Figure 3D:
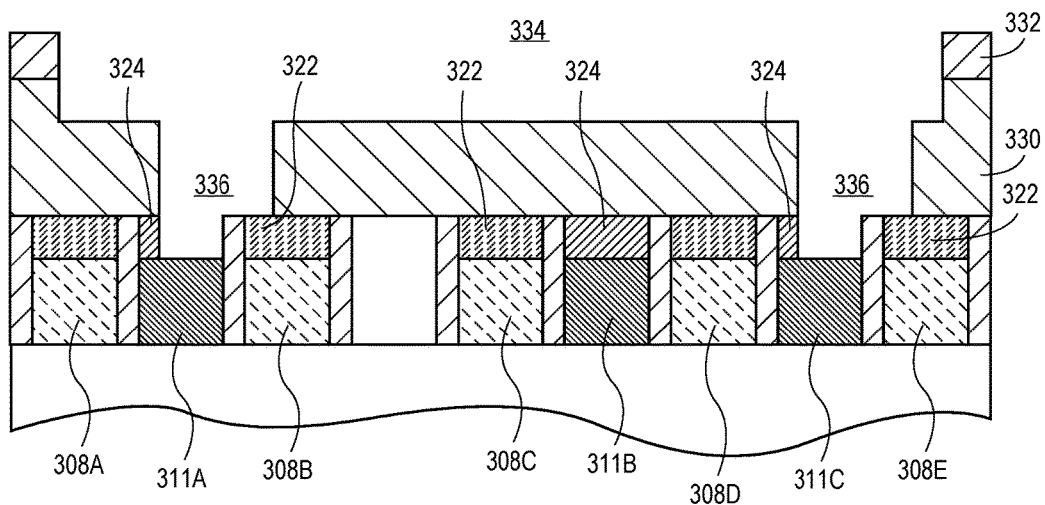

Referring to FIG. 3D, via openings 336 (e.g., VCT) are formed in inter-layer dielectric (ILD) 330, extending from metal (0) trench 334 to one or more of the recessed trench contacts 311A-311C. For example, in FIG. 3D, via openings are formed to expose recessed trench contacts 311A and 311C. The formation of via openings 336 includes etching of both inter-layer dielectric (ILD) 330 and respective portions of corresponding insulating cap layer 324. In one such embodiment, a portion of insulating cap layer 322 is exposed during patterning of inter-layer dielectric (ILD) 330 (e.g., a portion of insulating cap layer 322 over gate stack structures 308B and 308E is exposed). In that embodiment, insulating cap layer 324 is etched to form via openings 336 selective to (i.e., without significantly etching or impacting) insulating cap layer 322.

The via openings 336 may be formed by first depositing a hardmask layer, an anti-reflective coating (ARC) layer and a layer of photoresist. In an embodiment, the hardmask layer is composed substantially of carbon, e.g., as a layer of cross-linked organic polymer. In an embodiment, the ARC layer is suitable to suppress reflective interference during lithographic patterning of the photo-resist layer. In one such embodiment, the ARC layer is a silicon ARC layer. The photo-resist layer may be composed of a material suitable for use in a lithographic process. In one embodiment, the photo-resist layer is formed by first masking a blanket layer of photo-resist material and then exposing it to a light source. A patterned photo-resist layer may then be formed by developing the blanket photo-resist layer. In an embodiment, the portions of the photo-resist layer exposed to the light source are removed upon developing the photo-resist layer. Thus, patterned photo-resist layer is composed of a positive photo-resist material. In a specific embodiment, the photo-resist layer is composed of a positive photo-resist material such as, but not limited to, a 248 nm resist, a 193 nm resist, a 157 nm resist, an extreme ultra violet (EUV) resist, an e-beam imprint layer, or a phenolic resin matrix with a diazonaphthoquinone sensitizer. In another embodiment, the portions of the photo-resist layer exposed to the light source are retained upon developing the photo-resist layer. Thus, the photo-resist layer is composed of a negative photo-resist material. In a specific embodiment, the photo-resist layer is composed of a negative photo-resist material such as, but not limited to, consisting of poly-cis-isoprene or poly-vinyl-cinnamate.

In accordance with an embodiment of the present invention, the pattern of the photo-resist layer (e.g., the pattern of via openings 336) is transferred to the hardmask layer by using a plasma etch process. The pattern is ultimately transferred to the inter-layer dielectric (ILD) 330, e.g., by another or the same dry etch process. In one embodiment, the pattern is then finally transferred to the insulating cap layer 324 (i.e., the trench contact insulating cap layers) by an etch process without etching the insulating cap layer 322 (i.e., the gate insulating cap layers). The insulating cap layer 324 (TILA) may be composed of any of the following or a combination including silicon oxide, silicon nitride, silicon carbide, carbon doped silicon nitrides, carbon doped silicon oxides, amorphous silicon, various metal oxides and silicates including zirconium oxide, hafnium oxide, lanthanum oxide or a combination thereof. The layer may be deposited using any of the following techniques including CVD, ALD, PECVD, PVD, HDP assisted CVD, low temp CVD. A corresponding plasma dry etch is developed as a combination of chemical and physical sputtering mechanisms. Coincident polymer deposition may be used to control material removal rate, etch profiles and film selectivity. The dry etch is typically generated with a mix of gases that include $NF_3$, $CHF_3$, $C_4F_8$, HBr and $O_2$ with typically pressures in the range of 30-100 mTorr and a plasma bias of 50-1000 Watts. The dry etch may be engineered to achieve significant etch selectivity between cap layer 324 (TILA) and 322 (GILA) layers to minimize the loss of 322 (GILA) during dry etch of 324 (TILA) to form contacts to the source drain regions of the transistor.

Figure 3E:
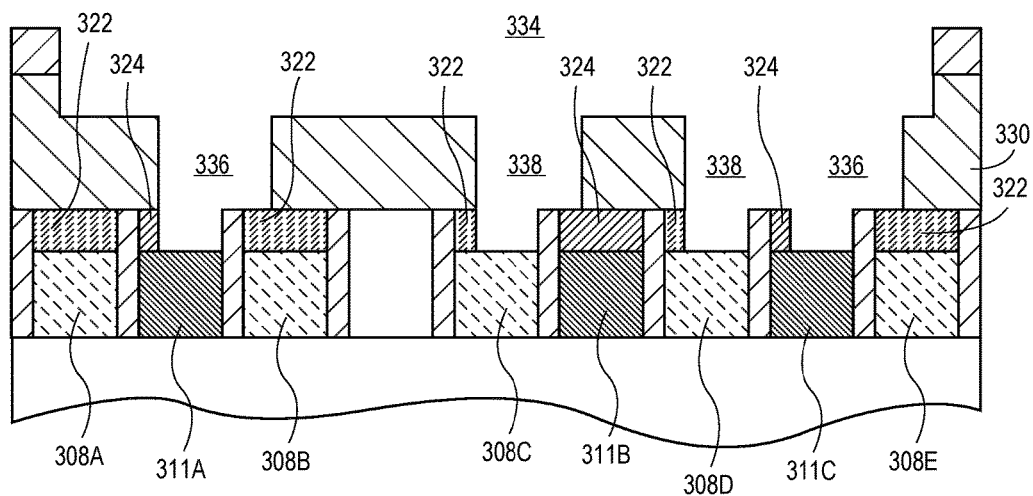

Referring to FIG. 3E, one or more additional via openings 338 (e.g., VCG) are formed in inter-layer dielectric (ILD) 330, extending from metal (0) trench 334 to one or more of the gate stack structures 308A-308E. For example, in FIG. 3E, via openings are formed to expose gate stack structures 308C and 308D. The formation of via openings 338 includes etching of both inter-layer dielectric (ILD) 330 and respective portions of corresponding insulating cap layer 322. In one such embodiment, a portion of insulating cap layer 324 is exposed during patterning of inter-layer dielectric (ILD) 330 (e.g., a portion of insulating cap layer 324 over recessed trench contact 311B is exposed). In that embodiment, insulating cap layer 322 is etched to form via openings 338 selective to (i.e., without significantly etching or impacting) insulating cap layer 324.

Similar to forming the via openings 336, the via openings 338 may be formed by first depositing a hardmask layer, an anti-reflective coating (ARC) layer and a layer of photoresist. In accordance with an embodiment of the present invention, the pattern of the photo-resist layer (e.g., the pattern of via openings 338) is transferred to the hardmask layer by using a plasma etch process. The pattern is ultimately transferred inter-layer dielectric (ILD) 330, e.g., by another or the same dry etch process. In one embodiment, the pattern is then finally transferred to the insulating cap layer 322 (i.e., the gate insulating cap layers) by an etch process without etching the insulating cap layer 324 (i.e., the trench contact insulating cap layers). The insulating cap layer 322 (GILA) may be composed of any of the following or a combination including silicon oxide, silicon nitride, silicon carbide, carbon doped silicon nitrides, carbon doped silicon oxides, amorphous silicon, various metal oxides and silicates including zirconium oxide, hafnium oxide, lanthanum oxide or a combination thereof. The layer may be deposited using any of the following techniques including CVD, ALD, PECVD, PVD, HDP assisted CVD, low temp CVD. The insulating cap layer 322 (GILA) is, in an embodiment, composed of a different material relative to cap layer 324 (TILA) to ensure significant etch rate differential between the two capping layers. A corresponding plasma dry etch may be developed as a combination of chemical and physical sputtering mechanisms to achieve acceptable etch rate differential between GILA and TILA films. Coincident polymer deposition may be used to control material removal rate, etch profiles and film selectivity. The dry etch is typically generated with a mix of gases that include $NF_3$, $CHF_3$, $C_4F_8$, HBr and $O_2$ with typically pressures in the range of 30-100 mTorr and a plasma bias of 50-1000 Watts. The dry etch may be engineered to achieve significant etch selectivity between cap layer 322 (GILA) and 324 (TILA) layers to minimize the loss of 324 (TILA) during dry etch of 322 (GILA) to form the gate contact on active regions of the transistor.

Figure 3F:
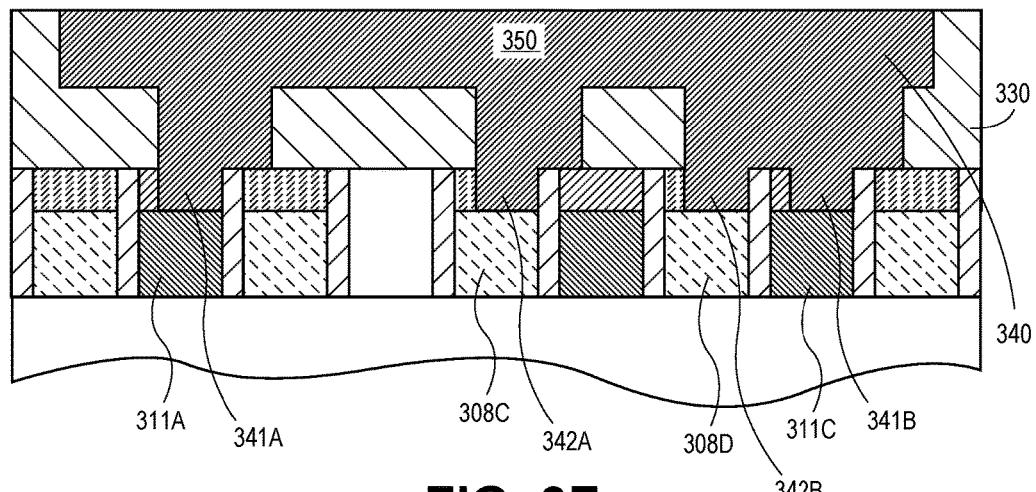

Referring to FIG. 3F, a metal contact structure 340 is formed in the metal (0) trench 334 and via openings 336 and 338 of the structure described in association with FIG. 3E. The metal contact structure 340 includes a metal (0) portion 350 along with trench contact vias (e.g., trench contact vias 341A and 341B to trench contacts 311A and 311C, respectively) and gate contact vias (e.g., gate contact vias 342A and 342B to gate stack structures 308C and 308D, respectively).

In an embodiment, the metal contact structure is formed by a metal deposition and subsequent chemical mechanical polishing operation. The metal deposition may involve first deposition of an adhesion layer followed by deposition of a fill metal layer. Thus, the metal structure 340 may be composed of a conductive material. In an embodiment, the metal structure 340 is composed of a metal species. The metal species may be a pure metal, such as copper, tungsten, nickel or cobalt, or may be an alloy such as a metal-metal alloy or a metal-semiconductor alloy (e.g., such as a silicide material).

Figure 4:
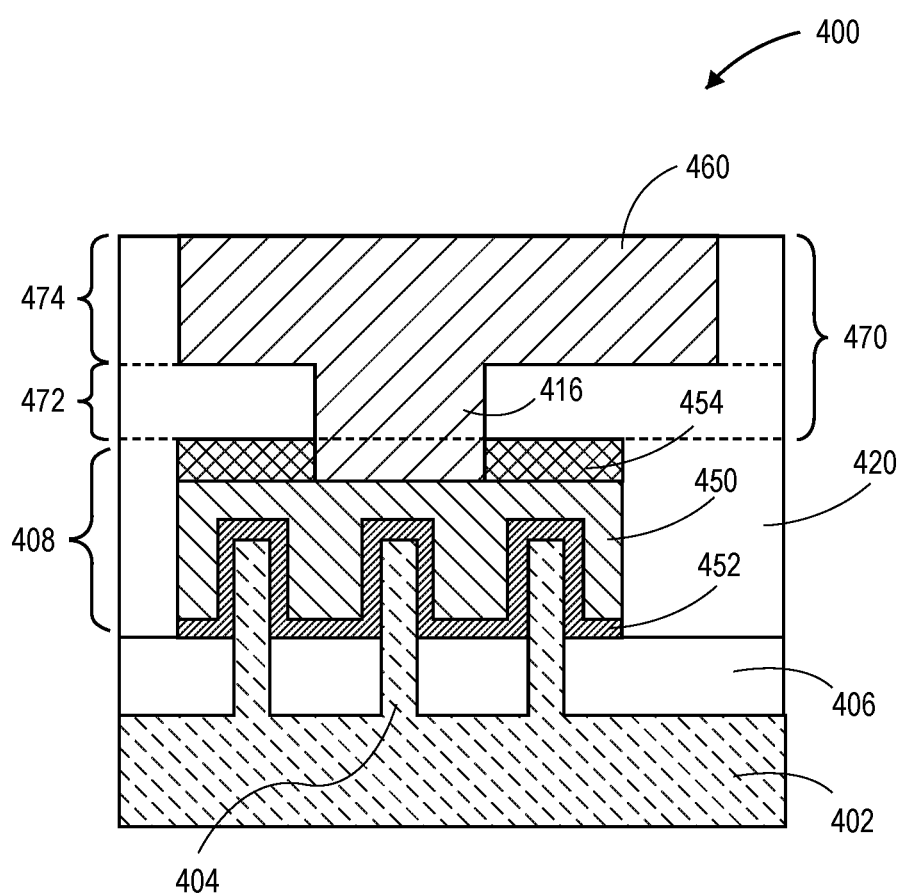
FIG. 4 illustrates a cross-sectional view of another non-planar semiconductor device having a gate contact via disposed over an active portion of a gate electrode, in accordance with another embodiment of the present invention.

As mentioned briefly above in association with FIG. 3C, ILD 330 may instead be a bi-layer structure. As an example, FIG. 4 illustrates a cross-sectional view of another non-planar semiconductor device having a gate contact via disposed over an active portion of a gate electrode, in accordance with another embodiment of the present invention. Referring to FIG. 4, a semiconductor structure or device 400, e.g. a non-planar device, includes a non-planar diffusion or active region 404 (e.g., a fin structure) formed from substrate 402, and within isolation region 406. A gate electrode stack 408 is disposed over the non-planar diffusion or active region 404 as well as over a portion of the isolation region 406. As shown, gate electrode stack 408 includes a gate electrode 450 and gate dielectric layer 452, along with a dielectric cap layer 454. The gate electrode stack 408 is disposed in an inter-layer dielectric layer 420, such as a layer of silicon oxide. A gate contact via 416 and an overlying metal interconnect 460 are both disposed in inter-layer dielectric (ILD) stacks or layers 470. In an embodiment, structure 470 is a bi-layer interlayer dielectric stack including a bottom layer 472 and a top layer 474, as depicted in FIG. 4.

In an embodiment, the top layer 474 of ILD structure 470 is composed of a material optimized for low-K performance, e.g., for reducing capacitive coupling between metal lines formed therein. In one such embodiment, the top layer 474 of ILD structure 470 is composed of a material such as, but not limited to, a carbon-doped oxide (CDO) or porous oxide film. In an embodiment, the bottom layer 472 of ILD structure 470 is composed of a material optimized for via etch selectivity, e.g., for compatibility with an integration scheme leveraging the etch selectivities between a trench contact cap layer and a gate cap layer. In one such embodiment, the bottom layer 472 of ILD structure 470 is composed of a material such as, but not limited to, silicon dioxide ($SiO_2$) or a CDO film. In a specific embodiment, the top layer 474 of ILD structure 470 is composed of a CDO material and the bottom layer 472 of ILD structure 470 is composed of $SiO_2$.

In the process flow, described in association with FIGS. 3A-3C, the tops of the spacers 320 are exposed during via opening formation in cap layers 324 and 322. In the case that the material of spacers 320 is different from that of the cap layers 324 and 322, and additional etch selectivity consideration may have to be accounted for in order to hinder unwanted degradation of the spacers during via opening formation. In a different embodiment, the spacers may be recessed to be essentially planar with the gate structures. In such an embodiment, the gate cap layer may be formed to cover the spacers, hindering exposure of the spacers during via opening formation. As an example, FIGS. 5A and 5B illustrate cross-sectional views representing various operations in a method of fabricating another semiconductor structure having a gate contact structure disposed over an active portion of a gate, in accordance with another embodiment of the present invention.

Figure 5A:
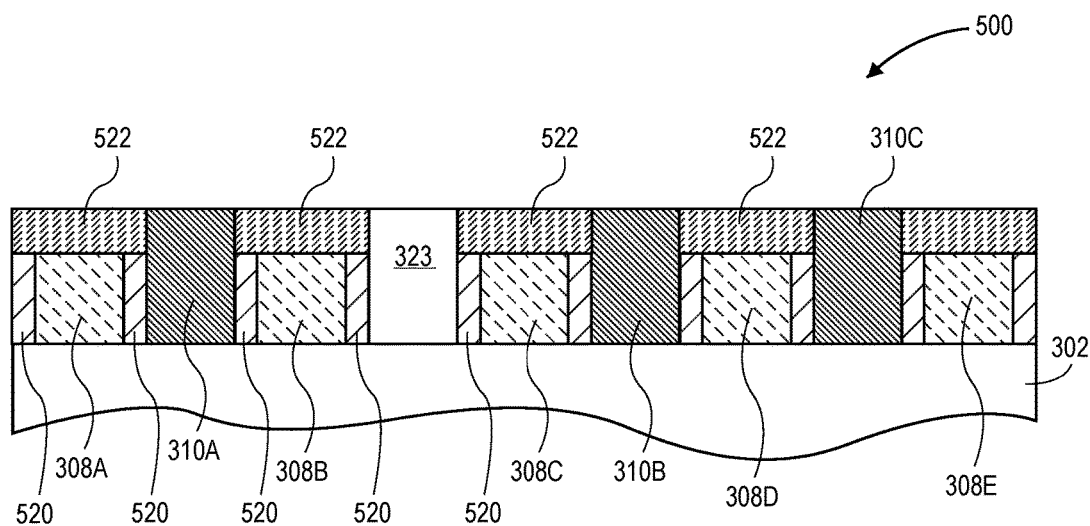
FIGS. 5A and 5B illustrate cross-sectional views representing various operations in a method of fabricating another semiconductor structure having a gate contact structure disposed over an active portion of a gate, in accordance with another embodiment of the present invention.

Referring to FIG. 5A, a semiconductor structure 500 is provided following trench contact (TCN) formation. It is to be understood that the specific arrangement of structure 500 is used for illustration purposes only, and that a variety of possible layouts may benefit from embodiments of the invention described herein. The semiconductor structure 500 includes one or more gate stack structures, such as gate stack structures 308A-308E disposed above a substrate 302. The gate stack structures may include a gate dielectric layer and a gate electrode, as described above in association with FIG. 2. Trench contacts, e.g., contacts to diffusion regions of substrate 302, such as trench contacts 310A-310C are also included in structure 500 and are spaced apart from gate stack structures 308A-308E by dielectric spacers 520. An insulating cap layer 522 is disposed on the gate stack structures 308A-308E (e.g., GILA), as is also depicted in FIG. 5A. However, in contrast to the structure 300 described in association with FIG. 3A, the spacers 520 have been recessed to approximately the same height as the gate stack structures 308A-308E. As such, the corresponding insulating cap layers 522 cover the spacers 520 associated with each gate stack, as well as covering the gate stack.

Figure 5B:
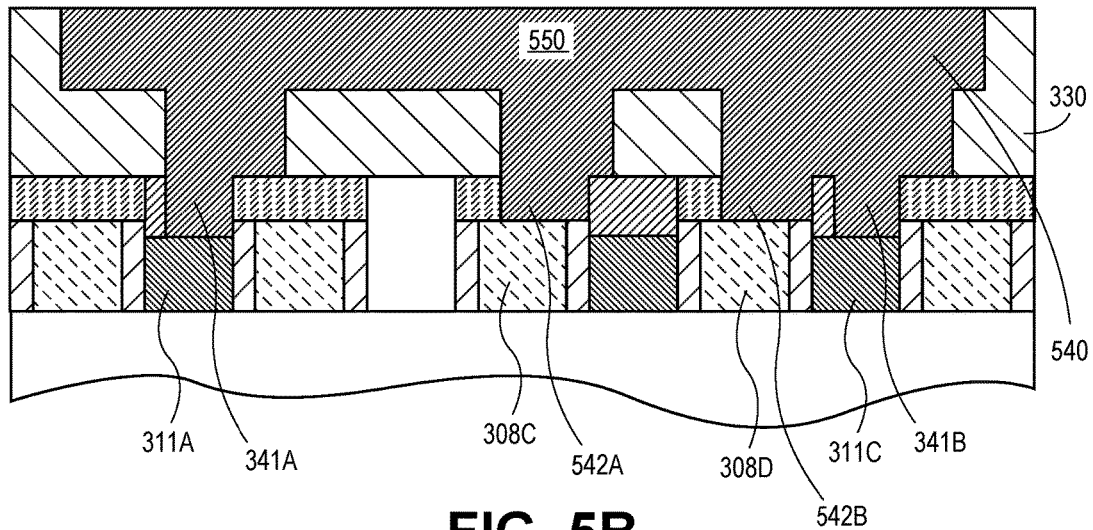

Referring to FIG. 5B, a metal contact structure 540 is formed in a metal (0) trench and via openings formed in a dielectric layer 330. The metal contact structure 540 includes a metal (0) portion 550 along with trench contact vias (e.g., trench contact vias 341A and 341B to trench contacts 311A and 311C, respectively). The metal contact structure 540 also includes gate contact vias (e.g., gate contact vias 542A and 542B to gate stack structures 308C and 308D, respectively). In comparison to the structure described in association with FIG. 3F, the resulting structure of FIG. 5B is slightly different since the spacers 522 are not exposed, yet coverage of the insulating cap layers 522 is extended, during etch formation of the via openings leading to gate contact vias 542A and 542B.

Referring again to FIG. 5B, in an embodiment, the trench contacts (including trench contacts labeled 311A and 311C in FIG. 5B) are recessed lower relative to the gate stack structures (including gate stack structures labeled 308C and 308D in FIG. 5). In one such embodiment, the trench contacts are recessed lower relative to the gate stack structures in order to prevent a possibility of shorting between gate contact vias 542A and 542B and trench contacts 311A and 311C, respectively, e.g., at the corners where gate contact vias 542A and 542B and trench contacts 311A and 311C, respectively, would otherwise meet if the trench contacts were co-planar with the gate stack structures.

Furthermore, in another embodiment (not shown), spacers are recessed to approximately the same height as the trench contacts. The corresponding trench insulating cap layers (TILA) cover the spacers associated with each trench contact, as well as covering the trench contact. In one such embodiment, the gate stack structures are recessed lower relative to the trench contacts in order to prevent a possibility of shorting between trench contact vias and adjacent or nearby gate stack structures.

Figure 6:
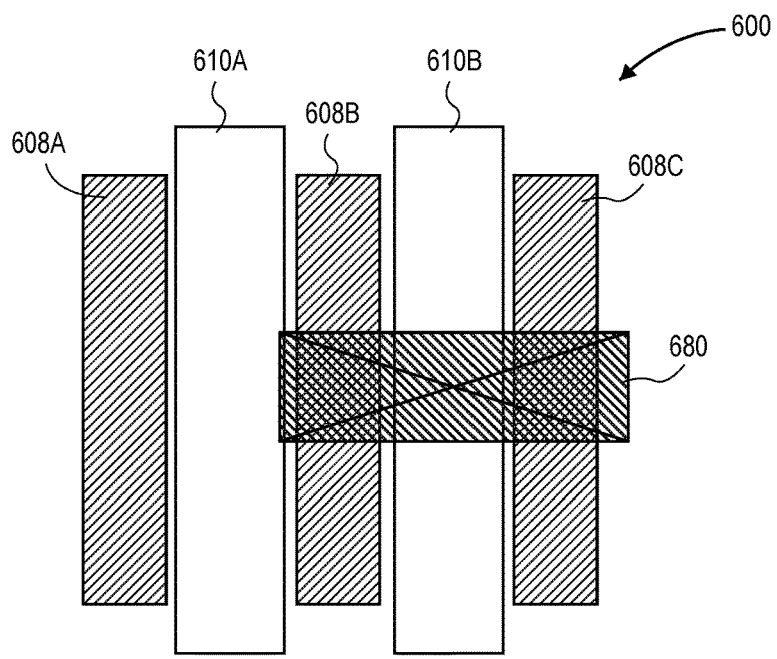
FIG. 6 illustrates a plan view of another semiconductor device having a gate contact via disposed over an active portion of a gate, in accordance with another embodiment of the present invention.

The approaches and structures described herein may enable formation of other structures or devices that were not possible or difficult to fabricate using conventional methodologies. In a first example, FIG. 6 illustrates a plan view of another semiconductor device having a gate contact via disposed over an active portion of a gate, in accordance with another embodiment of the present invention. Referring to FIG. 6, a semiconductor structure or device 600 includes a plurality of gate structures 608A-608C interdigitated with a plurality of trench contacts 610A and 610B (these features are disposed above an active region of a substrate, not shown). A gate contact via 680 is formed on an active portion the gate structure 608B. The gate contact via 680 is further disposed on the active portion of the gate structure 608C, coupling gate structures 608B and 608C. It is to be understood that the intervening trench contact 610B may be isolated from the contact 680 by using a trench contact isolation cap layer (e.g., TILA). The contact configuration of FIG. 6 may provide an easier approach to strapping adjacent gate lines in a layout, without the need to route the strap through upper layers of metallization, hence enabling smaller cell areas and/or less intricate wiring schemes.

Figure 7:
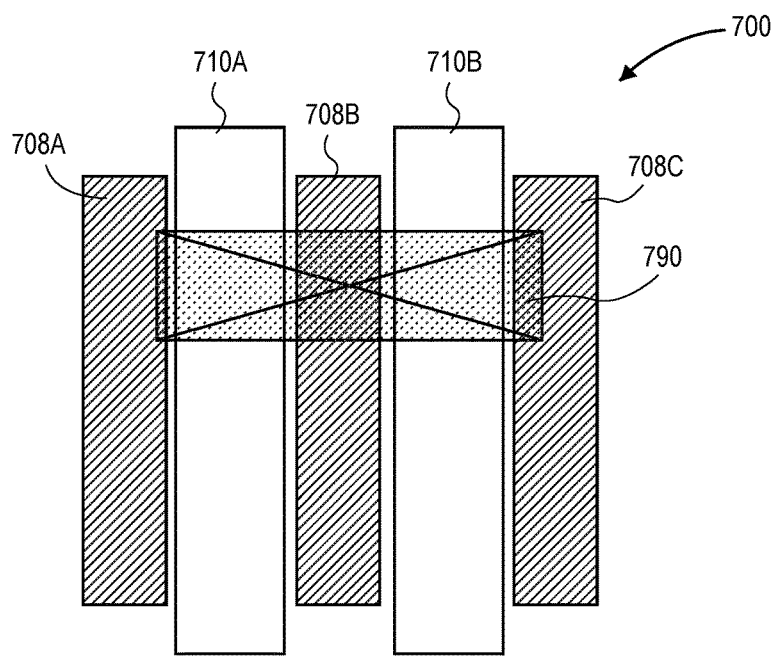
FIG. 7 illustrates a plan view of another semiconductor device having a trench contact via coupling a pair of trench contacts, in accordance with another embodiment of the present invention.

In a second example, FIG. 7 illustrates a plan view of another semiconductor device having a trench contact via coupling a pair of trench contacts, in accordance with another embodiment of the present invention. Referring to FIG. 7, a semiconductor structure or device 700 includes a plurality of gate structures 708A-708C interdigitated with a plurality of trench contacts 710A and 710B (these features are disposed above an active region of a substrate, not shown). A trench contact via 790 is formed on the trench contact 710A. The trench contact via 790 is further disposed on the trench contact 710B, coupling trench contacts 710A and 710B. It is to be understood that the intervening gate structure 708B may be isolated from the trench contact via 790 by using a gate isolation cap layer (e.g., by a GILA process). The contact configuration of FIG. 7 may provide an easier approach to strapping adjacent trench contacts in a layout, without the need to route the strap through upper layers of metallization, hence enabling smaller cell areas and/or less intricate wiring schemes.

It is to be understood that not all aspects of the processes described above need be practiced to fall within the spirit and scope of embodiments of the present invention. For example, in one embodiment, dummy gates need not ever be formed prior to fabricating gate contacts over active portions of the gate stacks. The gate stacks described above may actually be permanent gate stacks as initially formed. Also, the processes described herein may be used to fabricate one or a plurality of semiconductor devices. The semiconductor devices may be transistors or like devices. For example, in an embodiment, the semiconductor devices are a metal-oxide semiconductor (MOS) transistors for logic or memory, or are bipolar transistors. Also, in an embodiment, the semiconductor devices have a three-dimensional architecture, such as a trigate device, an independently accessed double gate device, or a FIN-FET. One or more embodiments may be particularly useful for fabricating semiconductor devices at a 10 nm or smaller technology node.

In general, prior to (e.g., in addition to) forming a gate contact structure (such as a via) over an active portion of a gate and in a same layer as a trench contact via, one or more embodiments of the present invention include first using a gate aligned trench contact process. Such a process may be implemented to form trench contact structures for semiconductor structure fabrication, e.g., for integrated circuit fabrication. In an embodiment, a trench contact pattern is formed as aligned to an existing gate pattern. By contrast, conventional approaches typically involve an additional lithography process with tight registration of a lithographic contact pattern to an existing gate pattern in combination with selective contact etches. For example, a conventional process may include patterning of a poly (gate) grid with separate patterning of contact features.

Figure 8:
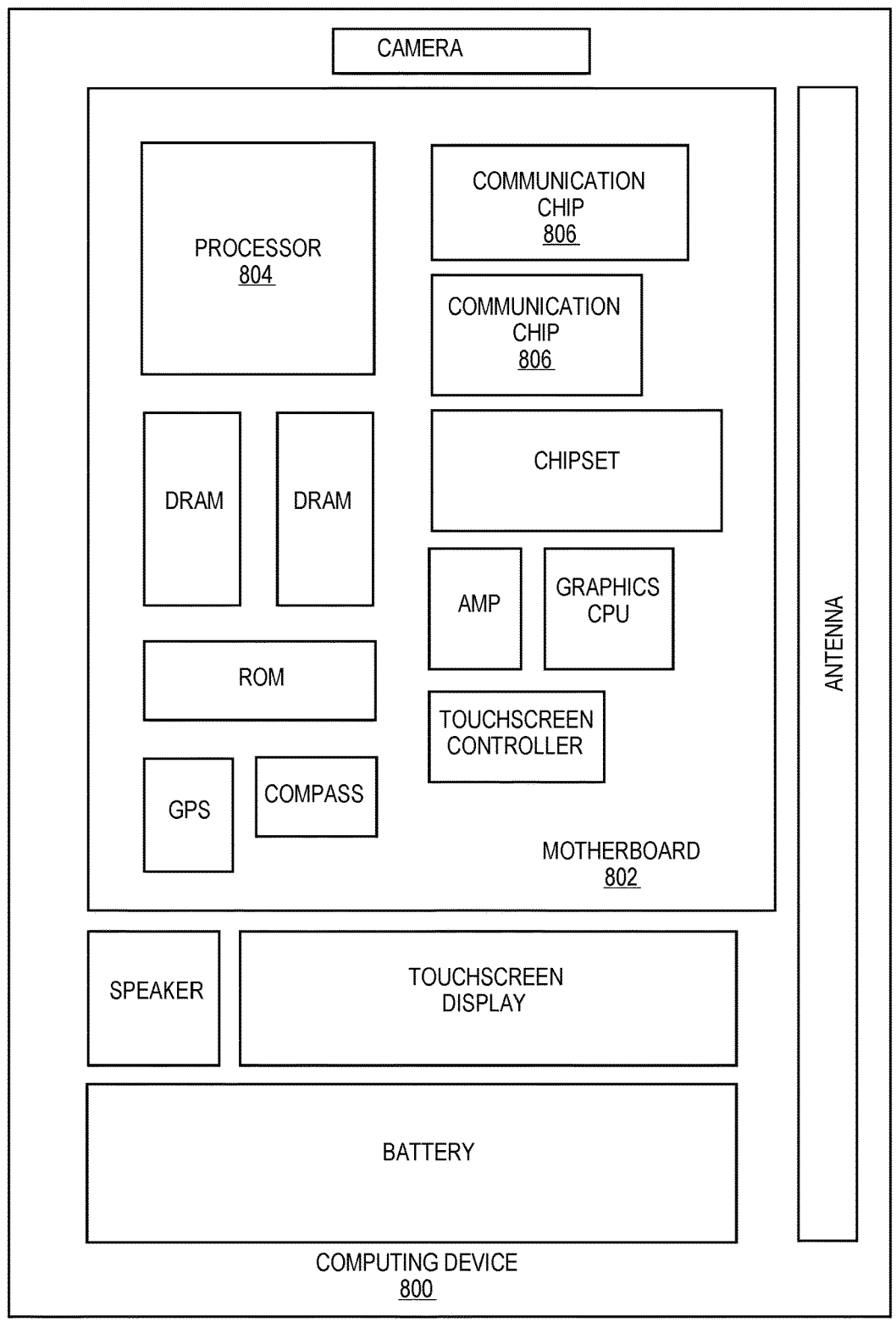
FIG. 8 illustrates a computing device in accordance with one implementation of the invention.

FIG. 8 illustrates a computing device 800 in accordance with one implementation of the invention. The computing device 800 houses a board 802. The board 802 may include a number of components, including but not limited to a processor 804 and at least one communication chip 806. The processor 804 is physically and electrically coupled to the board 802. In some implementations the at least one communication chip 806 is also physically and electrically coupled to the board 802. In further implementations, the communication chip 806 is part of the processor 804.

Depending on its applications, computing device 800 may include other components that may or may not be physically and electrically coupled to the board 802. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 806 enables wireless communications for the transfer of data to and from the computing device 800. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 806 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 800 may include a plurality of communication chips 806. For instance, a first communication chip 806 may be dedicated to shorter range wireless communications such as Wi-Fi and Bluetooth and a second communication chip 806 may be dedicated to longer range wireless communications such as GPS, EDGE, GPRS, CDMA, WiMAX, LTE, Ev-DO, and others.

The processor 804 of the computing device 800 includes an integrated circuit die packaged within the processor 804. In some implementations of the invention, the integrated circuit die of the processor includes one or more devices, such as MOS-FET transistors built in accordance with implementations of the invention. The term "processor" may refer to any device or portion of a device that processes electronic data from registers and/or memory to transform that electronic data into other electronic data that may be stored in registers and/or memory.

The communication chip 806 also includes an integrated circuit die packaged within the communication chip 806. In accordance with another implementation of the invention, the integrated circuit die of the communication chip includes one or more devices, such as MOS-FET transistors built in accordance with implementations of the invention.

In further implementations, another component housed within the computing device 800 may contain an integrated circuit die that includes one or more devices, such as MOS-FET transistors built in accordance with implementations of the invention.

In various implementations, the computing device 800 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 800 may be any other electronic device that processes data.

Thus, embodiments of the present invention include gate contact structures disposed over active portions of gates and methods of forming such gate contact structures.

In an embodiment, a semiconductor structure includes a substrate having an active region and an isolation region. A gate structure has a portion disposed above the active region and a portion disposed above the isolation region of the substrate. Source and drain regions are disposed in the active region of the substrate, on either side of the portion of the gate structure disposed above the active region. A gate contact structure is disposed on the portion of the gate structure disposed above the active region of the substrate.

In one embodiment, the gate contact structure is a self-aligned via.

In one embodiment, the active region of the substrate is a three-dimensional semiconductor body.

In one embodiment, the substrate is a bulk silicon substrate.

In an embodiment, a semiconductor structure includes a substrate having an active region and an isolation region. A plurality of gate structures is included, each having a portion disposed above the active region and a portion disposed above the isolation region of the substrate. A plurality of source or drain regions is disposed in the active region of the substrate, between the portions of the gate structures disposed above the active region. A plurality of trench contacts is included, a trench contact disposed on each of the source or drain regions. A gate contact via is disposed on one of the gate structures, on the portion of the gate structure disposed above the active region of the substrate. A trench contact via is disposed on one of the trench contacts.

In one embodiment, the gate contact via and the trench contact via are disposed essentially co-planar in a same inter-layer dielectric layer disposed above the substrate.

In one embodiment, the inter-layer dielectric layer is a bi-layer structure including a top low-k dielectric layer and a bottom etch selectivity layer.

In one embodiment, the gate contact via and the trench contact via are substantially co-planar with one another.

In one embodiment, each of the gate structures further includes a pair of sidewall spacers, and the trench contacts are disposed directly adjacent to the sidewall spacers of a corresponding gate structure.

In one embodiment, a top surface of the plurality of gate structures is substantially co-planar with a top surface of the plurality of trench contacts.

In one embodiment, the top surface of the plurality of gate structures and the top surface of the plurality of trench contacts are below a top surface of each of the pair of sidewall spacers.

In one embodiment, each of the plurality of gate structures includes a gate cap dielectric layer, or remnant thereof, on the top surface of the gate structure and substantially co-planar with the corresponding pair of sidewall spacers.

In one embodiment, each of the plurality of trench contacts includes a trench cap dielectric layer, or remnant thereof, on the top surface of the trench contact and substantially co-planar with the corresponding pair of sidewall spacers.

In one embodiment, the gate cap dielectric layer and the trench cap dielectric layer have different etch selectivities relative to one another.

In one embodiment, a top surface of the plurality of gate structures is approximately co-planar with a top surface of each of the pair of sidewall spacers.

In one embodiment, the gate contact via is further disposed on a second of the gate structures, on the portion of the second gate structure disposed above the active region of the substrate, and the gate contact via couples the one and the second gate structures.

In one embodiment, the trench contact via is further disposed on a second of the trench contacts and couples the one and the second trench contacts.

In one embodiment, the gate contact via is a self-aligned via, and the trench contact via is a self-aligned via.

In one embodiment, the active region of the substrate is a three-dimensional semiconductor body.

In one embodiment, the substrate is a bulk silicon substrate.

In one embodiment, the gate structures include a high-k gate dielectric layer and a metal gate electrode.

In an embodiment, a method of fabricating a semiconductor structure includes forming a plurality of gate structures above an active region of a substrate. The method also includes forming a plurality of source or drain regions in the active region of the substrate, between the gate structures. The method also includes forming a plurality of trench contacts, a trench contact formed on each of the source or drain regions. The method also includes forming a gate cap dielectric layer above each of the gate structures. The method also includes forming a trench cap dielectric layer above each of the trench contacts. The method also includes forming a gate contact via on one of the gate structures, the forming including etching the corresponding gate cap dielectric layer selective to a trench cap dielectric layer. The method also includes forming a trench contact via on one of the trench contacts, the forming including etching the corresponding trench cap dielectric layer selective to a gate cap dielectric layer.

In one embodiment, forming the gate contact via and the trench contact via includes forming conductive material for both in a same process operation.

In one embodiment, forming the plurality of gate structures includes replacing dummy gate structures with permanent gate structures.

In one embodiment, forming the plurality of trench contacts includes replacing dummy gate trench contact structures with permanent trench contact structures.

In one embodiment, the method further includes, prior to forming the plurality of gate structures, forming a three-dimensional body from the active regions of the substrate.

In one embodiment, forming the three-dimensional body includes etching fins in a bulk semiconductor substrate.

What is claimed is:

1. A semiconductor structure, comprising:
   a gate electrode above a substrate, the gate electrode having a bottom surface, a first portion of the gate electrode bottom surface over a single crystalline region of the substrate and a second portion of the gate electrode bottom surface over a trench isolation layer of the substrate;
   a source region or drain region in the single crystalline region of the substrate at a side of the gate electrode;
   a dielectric sidewall spacer laterally adjacent the side of the gate electrode;
   a gate etch stop layer over the gate electrode;
   a trench contact structure on the source region or drain region, laterally adjacent the dielectric sidewall spacer; and
   a single conductive via structure over and in contact with the trench contact structure, over the dielectric sidewall spacer, and over and in direct contact with the gate electrode, the conductive via structure in an opening in the gate etch stop layer, the opening exposing a portion of but not all of the gate electrode.

2. The semiconductor structure of claim 1, wherein the trench contact structure comprises tungsten.

3. The semiconductor structure of claim 2, wherein the conductive via structure comprises tungsten.

4. The semiconductor structure of claim 1, wherein the conductive via structure comprises an adhesion layer and a fill metal layer.

5. The semiconductor structure of claim 1, further comprising:
   a second dielectric sidewall spacer laterally adjacent a second side of the gate electrode opposite the side of the gate electrode, wherein the gate etch stop layer is over the second dielectric sidewall spacer.

6. The semiconductor structure of claim 1, wherein the dielectric sidewall spacer comprises silicon nitride.

7. The semiconductor structure of claim 1, wherein the gate etch stop layer comprises silicon nitride.

8. The semiconductor structure of claim 1, wherein the single crystalline region of the substrate is a silicon fin.

9. The semiconductor structure of claim 1, further comprising:
   a trench cap dielectric layer on a top surface of the trench contact structure, wherein the trench cap dielectric layer comprises a material different than a material of the gate etch stop layer.

10. The semiconductor structure of claim 1, further comprising:
    a high-k dielectric layer between the gate electrode and the single crystalline region of the substrate.

11. The semiconductor structure of claim 1, wherein the single conductive via structure is a first single conductive via structure, the semiconductor structure further comprising a second single conductive via structure electrically isolated from the first single conductive via structure.

12. A semiconductor structure, comprising:
    a gate electrode above a substrate, the gate electrode having a bottom surface, a first portion of the gate electrode bottom surface over a single crystalline region of the substrate and a second portion of the gate electrode bottom surface over a trench isolation layer of the substrate;
    a source region or drain region in the single crystalline region of the substrate at a side of the gate electrode;
    a dielectric sidewall spacer laterally adjacent the side of the gate electrode;
    a gate etch stop layer over the gate electrode;
    a trench contact structure directly on the source region or drain region, laterally adjacent the dielectric sidewall spacer; and
    a single conductive via structure over and in contact with the trench contact structure, over the dielectric sidewall spacer, and directly over and in contact with the gate electrode, the conductive via structure in an opening in the gate etch stop layer, the opening exposing a portion of but not all of the gate electrode.

13. The semiconductor structure of claim 12, wherein the single conductive via structure is a first single conductive via structure, the semiconductor structure further comprising a second single conductive via structure electrically isolated from the first single conductive via structure.

14. The semiconductor structure of claim 12, wherein the trench contact structure comprises tungsten.

15. The semiconductor structure of claim 12, wherein the conductive via structure comprises tungsten.

16. The semiconductor structure of claim 15, wherein the conductive via structure comprises an adhesion layer and a fill metal layer.

17. The semiconductor structure of claim 12, wherein the single crystalline region of the substrate is a silicon fin.

18. The semiconductor structure of claim 12, wherein the conductive via structure is in direct contact with the gate electrode.

* * * * *